United States Patent [19]
Sakurai et al.

[11] 4,178,403
[45] Dec. 11, 1979

[54] MASK BLANK AND MASK

[75] Inventors: Kunio Sakurai; Tadashi Kojima, both of Hino; Hiroshi Itoh, Tachikawa, all of Japan

[73] Assignee: Konishiroku Photo Industry Co., Ltd., Tokyo, Japan

[21] Appl. No.: 821,777

[22] Filed: Aug. 4, 1977

[51] Int. Cl.² .......................................... B32B 15/04
[52] U.S. Cl. .................................. 428/209; 156/656; 156/657; 427/259; 428/210; 428/469; 428/539; 428/332
[58] Field of Search ............... 428/209, 210, 469, 539, 428/332; 156/656, 657; 427/259

[56] References Cited
U.S. PATENT DOCUMENTS

| | | | |
|---|---|---|---|
| 3,758,326 | 9/1973 | Hennings et al. | 428/539 |
| 3,916,056 | 10/1975 | Feldstein | 428/469 |
| 3,922,420 | 11/1975 | Schnable et al. | 428/210 |
| 3,949,131 | 4/1976 | Fraser | 428/539 |

Primary Examiner—George F. Lesmes
Assistant Examiner—E. Rollins Buffalow
Attorney, Agent, or Firm—Martin A. Farber

[57] ABSTRACT

The mask blank is provided with a transparent coating layer interposed between a transparent substrate and a mask metal layer. The transparent coating layer is made of material which is resistant to an etching solution.

8 Claims, 3 Drawing Figures

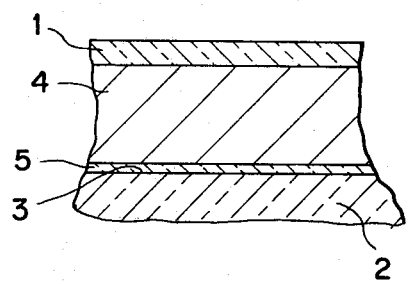
FIG. 1
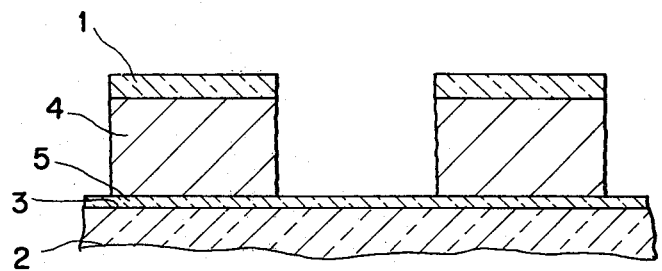
FIG. 2
FIG. 3
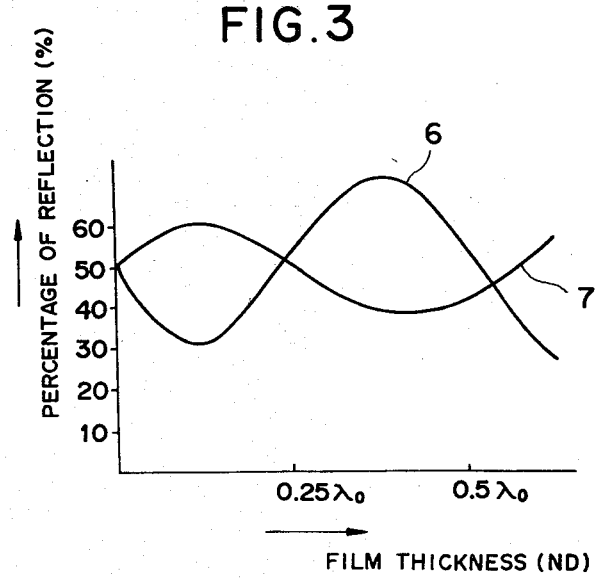

MASK BLANK AND MASK

BACKGROUND OF THE INVENTION

This invention relates to a mask blank and a mask utilized in the manufacture of semiconductor integrated circuit devices and high density integrated circuit devices, and more particularly improvement of a hard mask having a layer for intercepting exposure light.

Among mask blanks utilized to manufacture semiconductor devices, such as integrated circuit devices and the like, are included an emulsion mask which comprises a glass plate and a light-sensitive layer thereon mask which comprises a glass plate and a metal layer thereon. In recent years, the hard mask is preferably selected from masks, in view of its durability and high capability for resolution into a pattern of an integrated circuit. Usually, the hard mask is prepared by depositing a material such as chromium, chromium oxide, iron oxide, etc. on a glass substrate by vacuum evaporation or sputtering to form a mask film on the glass substrate. Recently, chromium is used as the mask metal in many cases. However, as the percentage of surface reflection of the chromium mask amounts to 50 to 60%, and thereby multiple reflections between the surfaces of the mask and a semiconductor wafer occur, the resolution of the pattern is degraded. For this reason, the so-called surface reflection-free chromium mask has been proposed, in which a chromium oxide film having a thickness of from 250 Å to 350 Å and anti-reflection performance is formed on the chromium film. In a chromium mask of this type the percentage of surface reflection for the i, h and g lines of the light emitted from a mercury lamp, which is used as an exposure light source in printing the pattern on the semiconductor wafer, is reduced to about 5 to 10%, thereby preventing a decrease in the resolution caused by the multiple reflections of the light between the wafer and the mask. Furthermore, the scratch resistance of the mask is improved by the provision of the chromium oxide film because the surface hardness of the chromium oxide film is higher than that of the chromium film.

In spite of the advantages described above, the surface reflection-free type chromium mask has the following problems.

(1) There is a tendency to form pin holes due to staining and dimming of the surface of the substrate.

More particularly, the blank of a hard mask is generally prepared by vacuum evaporating or sputtering such mask, forming material as chromium, chromium oxide, iron oxide, etc., on the surface of a glass substrate which has been ground and washed. However, the surface of the substrate which has been activated by the grinding step inevitably suffers from abnormalization such as staining and dimming at an early stage. More particularly, the surface stain appears at an early stage on the entire surface as fine dots having a diameter of about 1 to 2 microns and these stain dots grow and increase in number with time. Accordingly, when a metal film is formed by vacuum evaporation or sputtering on the surface of a glass plate on which stains and dimming exist, the metal film will contain pin holes so that it is essential to vapor deposit or sputter the metal film immediately after grinding of the glass substrate. Such requirement makes it impossible to carry out the grinding step of the glass substrate and the coating step of the mask metal by different manufacturers.

(2) The life of the mask is relatively short.

The hard mask is completed by etching off a portion of the mask metal of the blank. In the completed hard mask the surface hardness of the exposed portion of the glass substrate is smaller than that of the mask metal and the exposed portion tends to suffer from the abnormalization. For this reason, even when chromium oxide is used, which has a relatively large surface hardness, the life of the hard mask is governed by the damage of the surface of the glass substrate having a relatively small hardness and the degree of surface abnormalization.

Even with a mask formed with a chromium oxide film on the surface of the metal mask, for example chromium, the percentage of reflection of the light incident from the rear surface of the glass substrate amounts to about 50 to 60%. For this reason, when a mask and a wafer are aligned by using a reflection type autoaligner, the percentage of the surface reflection at the surface of target patterns is substantially the same as that at the surface of the portion surrounding the target pattern, so that there is only very low contrast, thereby degrading the alignment accuracy. For the purpose of solving these problems interposition of a chromium oxide film between the glass substrate and the chromium film has been attempted. However formation of the chromium oxide film on the surface of the glass substrate causes pin holes. Moreover, since the chromium oxide film is etched off by the etching treatment together with the chromium film, the provision of the chromium oxide film does not serve to enhance the durability of the mask.

BRIEF SUMMARY OF THE INVENTION

Accordingly, it is an object of this invention to provide a mask blank and a mask which is free from the above-mentioned defects.

According to this invention, these and further objects can be accomplished by providing a mask blank and a mask, respectively, comprising an optically transparent substrate, a transparent coating layer covering the entire surface of the substrate and made of material which is resistant to etching solutions, and a mask layer overlying the coating layer. According to this invention the coating layer is made of a material which is resistant to the etching solution, the material being magnesium fluoride, silicon oxide, calcium oxide, cerium fluroide, aluminum oxide, cerium oxide, lanthanium fluoride, indium oxide, magnesium oxide, titanium oxide, zirconium oxide, tin oxide, cadmium oxide, antimony oxide or a mixture thereof. As preferable examples of the mixture, there can be mentioned indium oxide-tin oxide, tin oxide-antimony oxide. Further, dopants such as tungsten oxide and, moribudenum oxide can be incorporated into the coating layer of the above-exampled material.

The mask of this invention is prepared by selectively removing the metal mask layer through a suitable etching treatment to form a pattern. As the etching treatment, a wet type treatment can be utilized using an etching solution such as cerium nitrate and perchloric acid-containing solution, cerium nitrate and acetic acid-containing solution, cerium sulfate and sulfuric acid-containing solution, or red prussiate and potassium hydroxide-containing solution; and a dry type treatment using an etching gas such as $Cl_2+O_2+Ar$ gas, $CCl_4+Ar$ gas, $Cl_2+O_2+He$ gas, or $CCl_4+Air$ gas.

BRIEF DESCRIPTION OF THE DRAWING

With the above and other objects and advantages in view, the present invention will become more clearly understood in connection with the following detailed description of a preferred embodiment, when considered with the accompanying drawings, of which:

FIG. 1 is an enlarged sectional view of a mask of this invention partly broken away;

FIG. 2 is an enlarged sectional view of a mask of this invention; and

FIG. 3 is a graph showing the relationship between the thickness of the coating layer and the percentage of reflection.

DESCRIPTION OF THE PREFERRED EMBODIMENT

FIG. 1 shows one embodiment of this invention in which the invention is applied to a chromium mask having an antireflection layer 1 composed of a chromium oxide film. According to this invention, over the entire surface 3 of a substrate 2 made of optical glass, for example, a coating layer 5 is formed having a uniform thickness, and a metal mask layer 4 made of pure chromium, for example, is applied on the coating layer 5 by vacuum evaporation or sputtering. The coating layer 5 is made of a material which is resistant to an etchant for the metal mask layer 4; and transparent to light within a wavelength range of from 350 m$\mu$ to 450 m$\mu$ of an exposure light source, for example an ultrahigh voltage mercury lamp. The coating layer 5 is formed on the surface of the glass substrate by conventional coating techniques such as vacuum evaporation sputtering and chemical vapor deposition.

The following Table 1 shows materials for the coating layer 5 that can satisfy the chemical, optical and physical properties described above. Any of these materials can be deposited on the surface of the glass substrate by one of the coating techniques described above.

TABLE 1

| Material | Refractive index |
| --- | --- |
| Magnesium fluoride | 1.38 |
| silicon oxide | 1.46–1.7 |
| calcium oxide | 1.84 |
| cerium fluoride | 1.61 |
| aluminum oxide | 1.58 |
| cerium oxide | 2.15 |
| lanthanium fluoride | 1.67 |
| indium oxide | 2.0 |
| magnesium oxide | 1.73 |
| titanium oxide | 2.3 |
| zirconium oxide | 2.1 |
| tin oxide | 2.10 |
| cadmium oxide | 2.06 |
| antimony oxide | 1.85 |

According to our experiment no surface stain was noted on the coating layer 5 when films of magnesium fluoride, silicon oxide, indium oxide, titanium oxide and zirconium oxide listed in this table were respectively coated on the glass substrates, the coated substrate was left in atmosphere for about one year and then the surface was inspected by a microscope.

The property of the coating layer 5 varies depending on the depositing process. When the conditions at the depositing are suitably selected, the coating layer 5 which exhibits electric conductivity is obtained. Particularly, the coating layer 5 having the conductivity higher than $10^4 \Omega\square$ (square), which is represented by resistivity, was obtained. The mask which comprises the electrical conductive coating layer 5 has advantages as follows:

(1) Since the mask has a conductive layer, accumulation of electrostatic charge on the mask is prevented, so that deposition of dust upon the mask is prevented.

(2) The accumulation of electrostatic charge is conspicuous when the mask is repeatedly contacted with and removed from the wafer. When electrostatic charge more than a certain value is accumulated on the mask, there occurs a discharge through the constitution layers of the mask, which causes the destruction of the mask layer. According to a mask having a conductive coating layer 5, the above undesired phenomenon does not occur.

(3) Upon inspection of the mask pattern with use of a scanning type electron microscope, electron beams are disturbed by the electrostatic charge of the mask, so that correct inspection is impossible. As above-mentioned, the accumulation of the electrostatic charge is prevented in a mask having a conductive coating layer 5, and consequently disturbance of the electron beam is prevented. When the complex refractive index Ncr of chromium is utilized as the mask metal layer 4, it is expressed by:

$$Ncr = 0.57 - i \times 1.8$$

The thickness ND of the coating layer 5 for the minimum reflectance of the coating layer is given by:

(1) where $N > Ns$ $$(0.1 + n/2)\lambda_o < ND < (0.15 + n/2)\lambda_o$$

(2) where $N < Ns$ $$(n/2 - 0.15)\lambda_o < ND < (n/2 - 0.1)\lambda_o$$

where
- i: a complex number
- N: refractive index of the coating layer 5
- Ns: refractive index of the glass substrate 1
- $\lambda_o$: typical value of the wavelength of the incident light
- n: an integer Thus, those skilled in the art can readily determine the thickness of the coating layer of a particular material from the refractive index thereof described in Table 1 and by using these equations. However, as is well known in the art as the complex refractive index varies considerably depending upon the method of manufacturing the mask layer 4 it is necessary to take this factor into consideration. However, according to our experiments, it was found that the film thickness ND is not strictly limited to the values determined by said equations but values close thereto can also attain the desired result.

FIG. 3 is a graph showing the relationship between the thickness ND of the coating layer 5 which was determined experimentally and the percentage of reflection in which curve 6 shows the percentage of reflection of a coating layer composed of zirconium oxide, while curve 7 is that of a coating layer composed of magnesium fluoride. As can be noted from FIG. 3, the minimum values of curves 6 and 7 lie near the values of the film thickness derived from equations 1 and 2.

As described above, in this invention, the glass substrate which has been activated by grinding step is covered by the coating layer 5, whereby the abnormalization can be almost completely prevented. This increases the possibility of carrying out the grinding step of the glass substrate and the deposition step of the coating layer 5 and the deposition step of the mask metal layer 5 in different factories.

FIG. 2 shows a completed photomask obtained by subjecting the mask metal layer 4 and the coating layer 5 of the photomask blank shown in FIG. 1 to a pattern forming process. Such a pattern forming process is well known, for example, in British Pat. No. 1,057,105 and Japanese Patent Publication No. 21227/1975. As described above since the coating layer is made of material resistant to the etching solution and has a stable surface, it is not only corroded at the etching treatment but also its exposed surface is not stained. Moreover, since the surface hardness of the materials shown in Table 1 is larger than that of the glass substrate, scratches would not be formed. In other words, according to the photomask of this invention, the surface of the glass substrate is protected by a hard and chemically stable layer so that it is possible to elongate the life of the photomask.

Although the invention has been described in terms of a preferred embodiment thereof it should be understood that the invention is not limited thereto and that many changes and modifications will be obvious to one skilled in the art without departing from the spirit and scope of the invention as defined in the appended claims.

What is claimed is:

1. A mask blank comprising
    an optically transparent substrate,
    an electrically conductive and transparent coating layer covering substantially the entire surface of said substrate and being made of material which is resistant to an etchant, said coating layer being formed by vacuum evaporation,
    a chromium mask layer overlying said coating layer and formed by vacuum evaporation or sputtering, said mask layer being capable of being etched off by the etchant, and
    an anti-reflection layer made of chromium oxide overlaying said mask layer.

2. The mask prepared by subjecting said mask layer of said mask blank according to claim 1 to a pattern forming process.

3. The mask blank according to claim 1, wherein said coating layer essentially comprises a material selected from the group consisting of indium oxide, titanium oxide, zirconium oxide, tin oxide and a mixture of at least two of the preceding materials.

4. A mask blank according to claim 3, wherein
    said coating layer contains a dopant selected from the group consisting of tungsten oxide and moribudenum oxide.

5. The mask blank according to claim 1, wherein the thickness ND of said coating layer is given by an equation $$(0.1+n/2)\lambda_o < ND < (0.15+n/2)\lambda_o$$

where n represents an integer $\lambda_o$ represents the wavelength of the incident light.

6. A mask blank according to claim 1, wherein the thickness ND of said coating layer is given by an equation $$(n/2-0.15)\lambda_o < ND < (n/2-0.1)\lambda_o$$

wherein n represents an integer and $\lambda_o$ represents the wavelength of the incident light.

7. A mask blank according to claim 1, wherein said coating layer has a conductivity higher than $10^4 \Omega\square$ (square centimeter).

8. A mask which is produced by the steps of
    subjecting a mask blank made of chromium having a photosensitive layer thereon to a pattern forming step including
    etching off a mask layer of the mask,
    comprising a glass substrate, a conductive and transparent layer substantially entirely overlying said glass substrate, and a patterned layer partially overlaying said overlying layer, said patterned layer consists of a mask layer of chromium and an anti-reflection layer thereon of chromium oxide.

* * * * *